(12) United States Patent
Kugimiya et al.

(10) Patent No.: US 9,917,091 B2
(45) Date of Patent: Mar. 13, 2018

(54) SEMICONDUCTOR DEVICE AND METHOD OF MANUFACTURING THE SAME

(71) Applicant: SONY CORPORATION, Tokyo (JP)

(72) Inventors: Katsuhisa Kugimiya, Kanagawa (JP); Kenichi Murata, Kanagawa (JP); Hitoshi Okano, Kanagawa (JP); Shigetaka Mori, Kanagawa (JP); Hiroyuki Kawashima, Kumamoto (JP); Takuma Matsuno, Kumamoto (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 15/312,759

(22) PCT Filed: May 28, 2015

(86) PCT No.: PCT/JP2015/065355
§ 371 (c)(1),
(2) Date: Nov. 21, 2016

(87) PCT Pub. No.: WO2015/190298
PCT Pub. Date: Dec. 17, 2015

(65) Prior Publication Data
US 2017/0207223 A1 Jul. 20, 2017

(30) Foreign Application Priority Data

Jun. 11, 2014 (JP) .................................. 2014-120852

(51) Int. Cl.
*H01L 21/8242* (2006.01)
*H01L 29/04* (2006.01)
(Continued)

(52) U.S. Cl.
CPC ...... *H01L 27/10847* (2013.01); *H01L 27/108* (2013.01); *H01L 27/1462* (2013.01); *H01L 27/14634* (2013.01)

(58) Field of Classification Search
CPC . H01L 27/10; H01L 27/108; H01L 27/14634; H01L 27/1462; H01L 27/10847
(Continued)

(56) References Cited

U.S. PATENT DOCUMENTS 5,747,830 A * 5/1998 Okita ................ G02F 1/136209
249/110
2015/0004738 A1 1/2015 Fujii et al.
(Continued)

FOREIGN PATENT DOCUMENTS

JP         7-66197 A       3/1995
JP      H0766197 A  *     3/1995
(Continued)

OTHER PUBLICATIONS

International Search Report and Written Opinion of PCT Application No. PCT/JP2015/065355, dated Aug. 11, 2015, 8 pages of English Translation and 7 pages of ISRWO.

*Primary Examiner* — David S Blum
(74) *Attorney, Agent, or Firm* — Chip Law Group

(57) ABSTRACT

A method of manufacturing a semiconductor device, includes: forming an insulating film on a first surface of a semiconductor substrate; and forming a hydrogen supply film on a second surface facing the first surface of the semiconductor substrate, the hydrogen supply film containing one or more of silicon oxide, TEOS, BPSG, BSG, PSG, FSG, carbon-containing silicon oxide, silicon nitride, carbon-containing silicon nitride, and oxygen-containing silicon carbide.

11 Claims, 11 Drawing Sheets

(51) Int. Cl.
*H01L 31/0376* (2006.01)
*H01L 31/20* (2006.01)
*H01L 31/036* (2006.01)
*H01L 27/108* (2006.01)
*H01L 27/146* (2006.01)

(58) Field of Classification Search
USPC .................................... 438/239; 257/59, 72
See application file for complete search history.

(56) References Cited

U.S. PATENT DOCUMENTS

| 2015/0221694 A1* | 8/2015 | Baba ................ H01L 27/14634 |
| | | 257/443 |
| 2017/0062580 A1* | 3/2017 | Hayashi .............. H01L 29/4908 |

FOREIGN PATENT DOCUMENTS

| JP | 2000-228525 A | | 8/2000 |
| JP | 2000228525 A | * | 8/2000 |
| JP | 2002-16249 A | | 1/2002 |
| JP | 2002073680 A | * | 3/2002 |
| JP | 2006-73680 A | | 3/2006 |
| WO | 2013/108657 A1 | | 7/2013 |

* cited by examiner

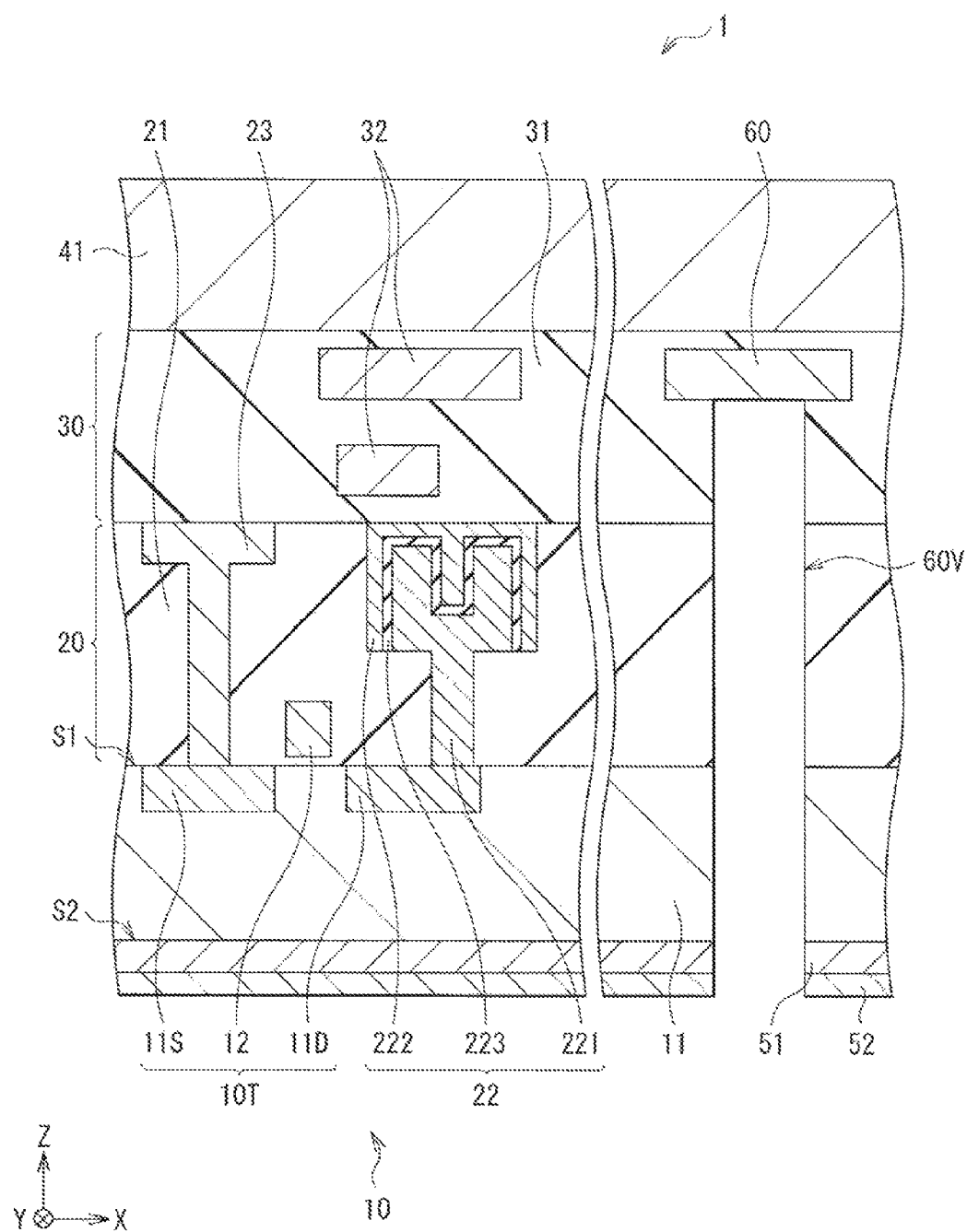
[ FIG. 1 ]

[FIG. 2]
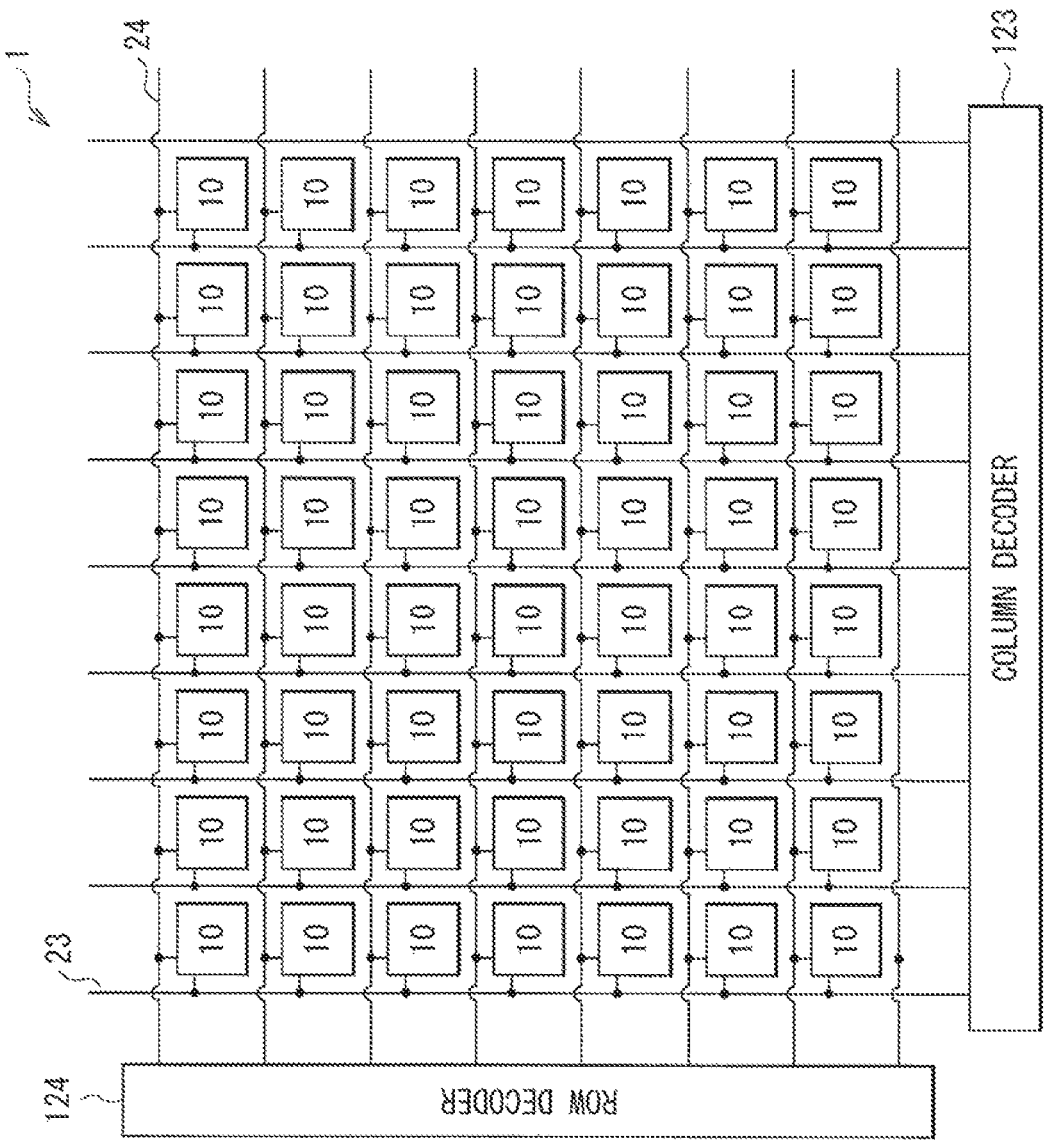

[ FIG. 3A ]
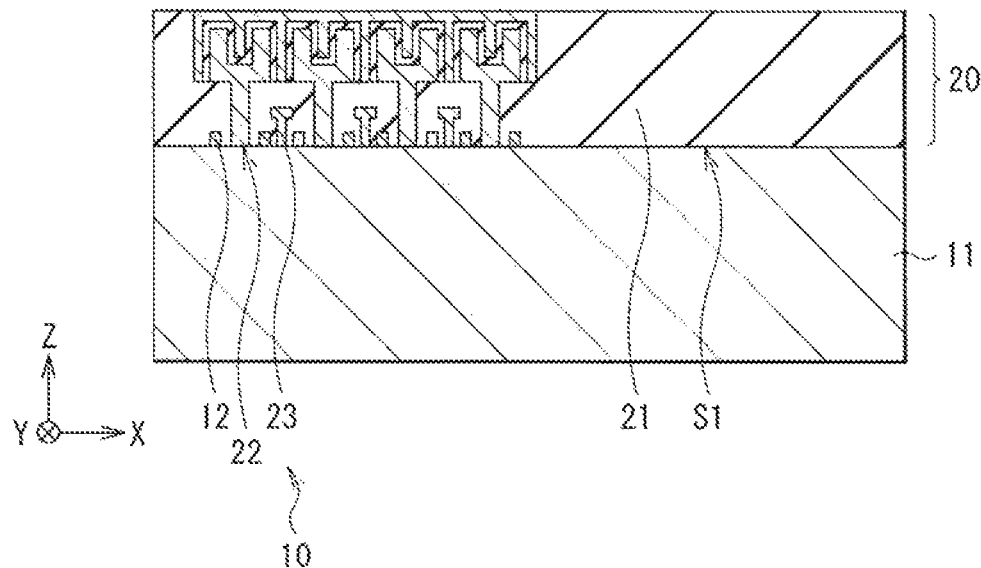
[ FIG. 3B ]
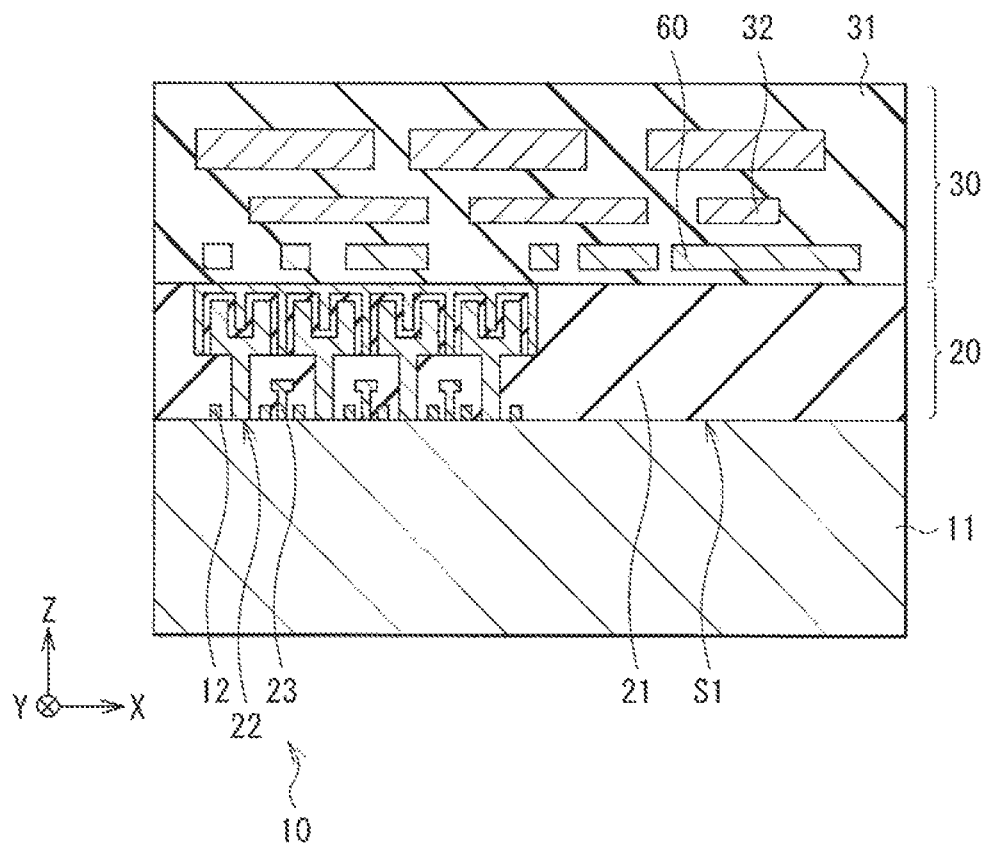

[ FIG. 4A ]
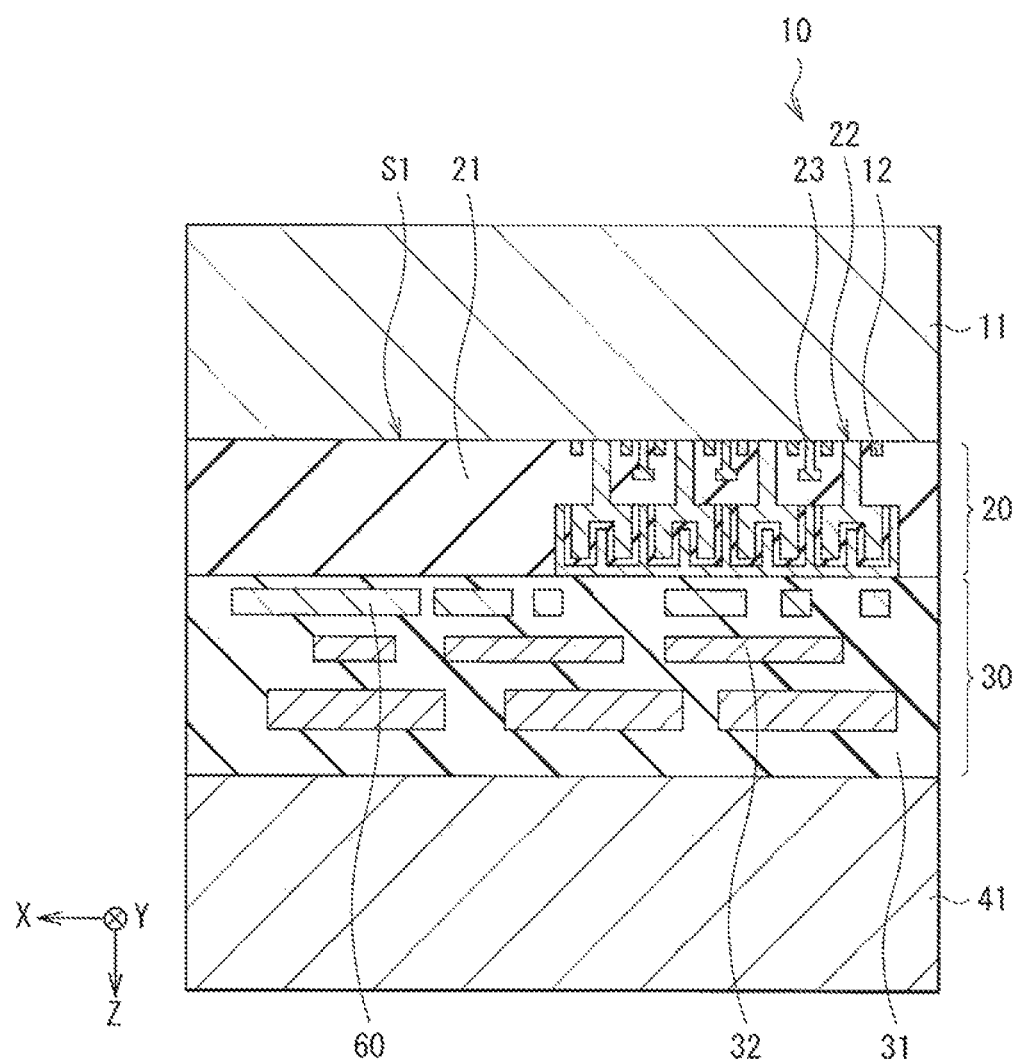

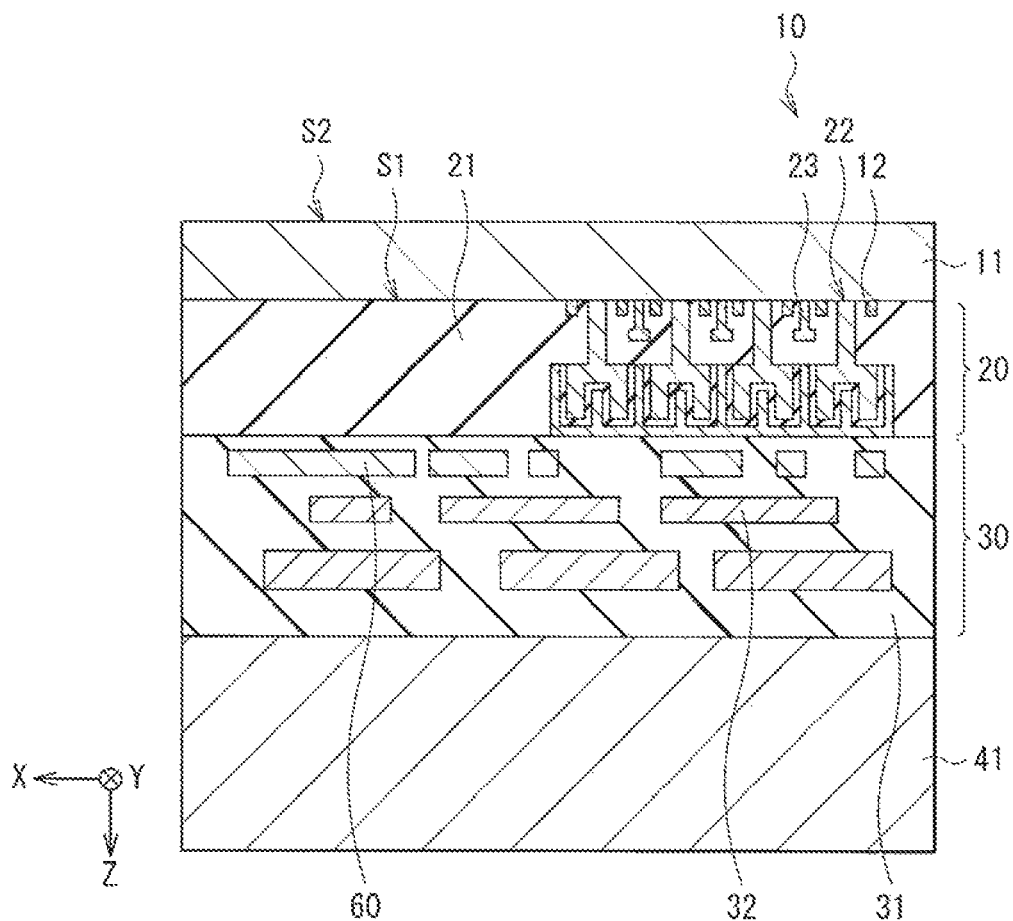
[FIG. 4B]

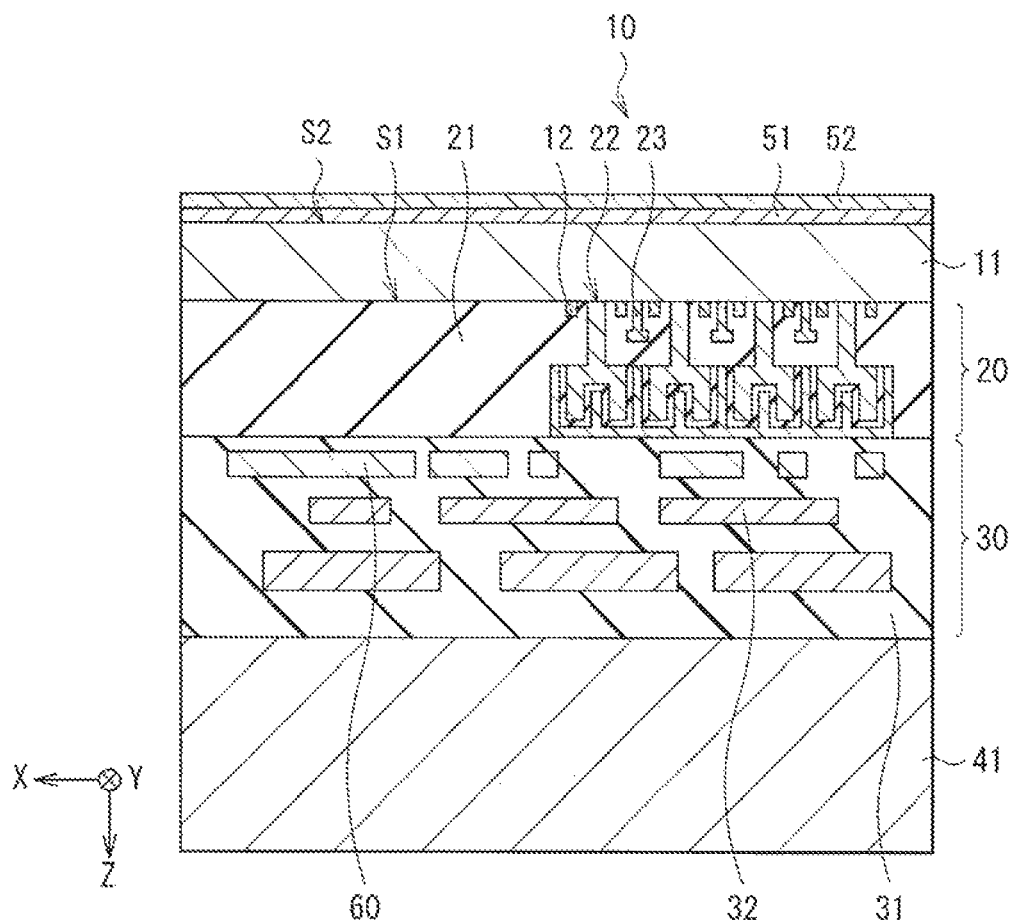
[FIG. 5A]

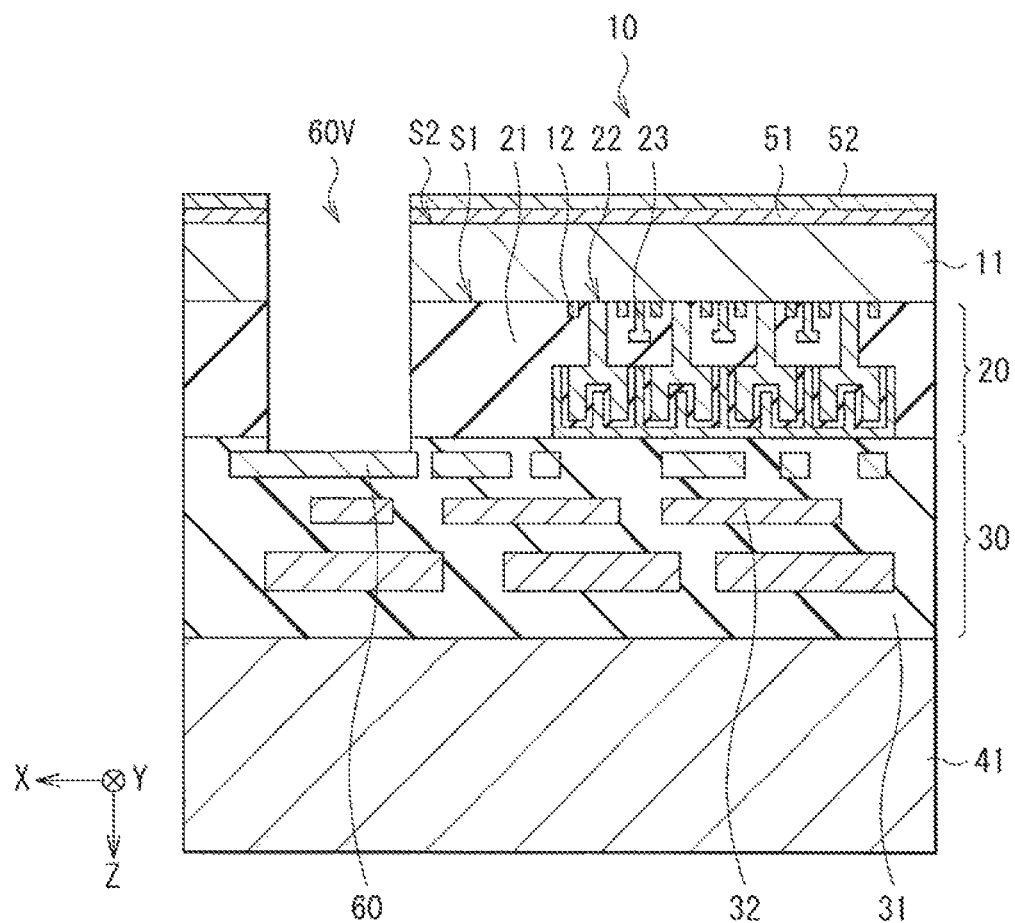
[FIG. 5B]

[FIG. 6]
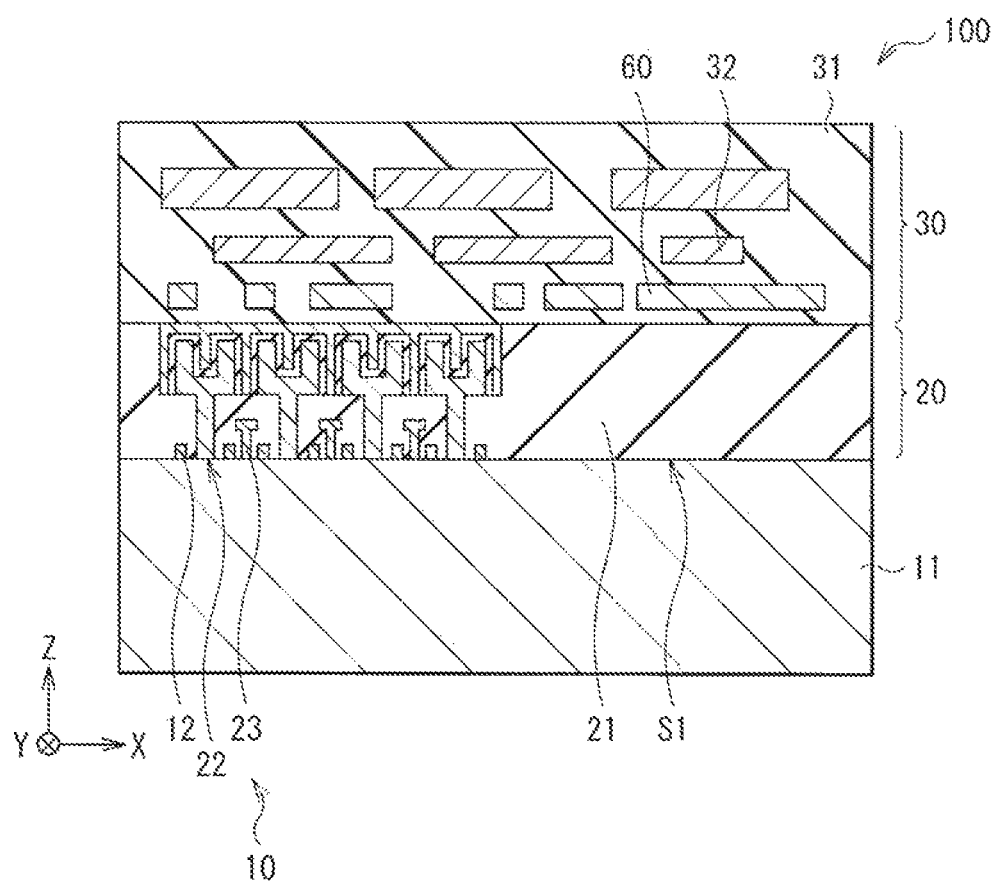

[FIG. 7]
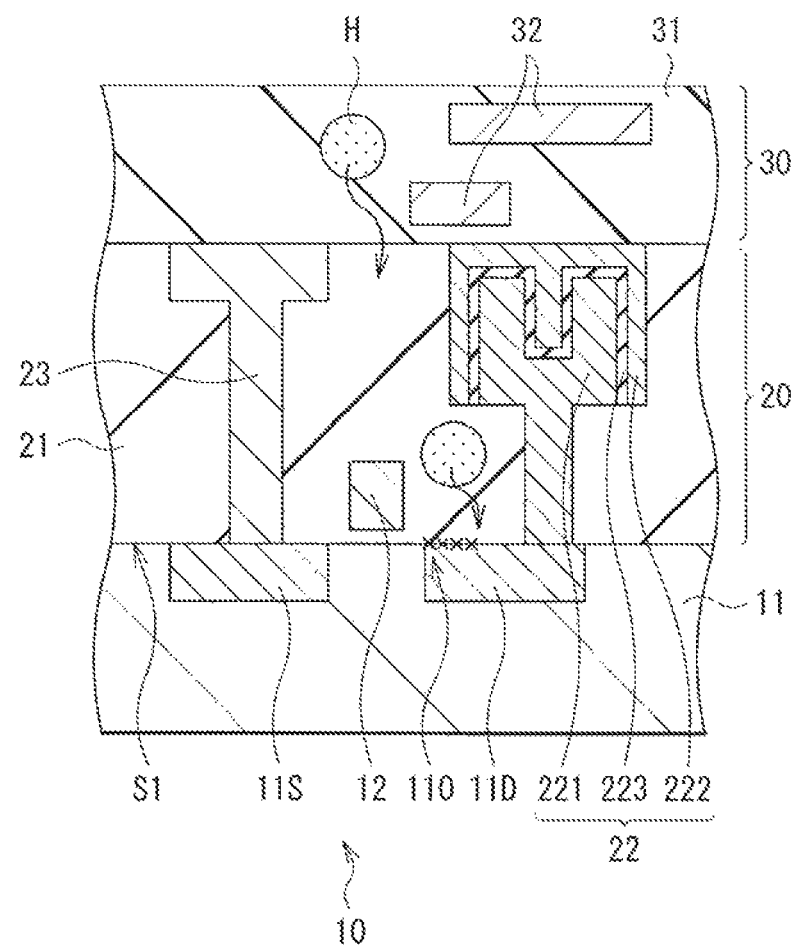

[ FIG. 8 ]
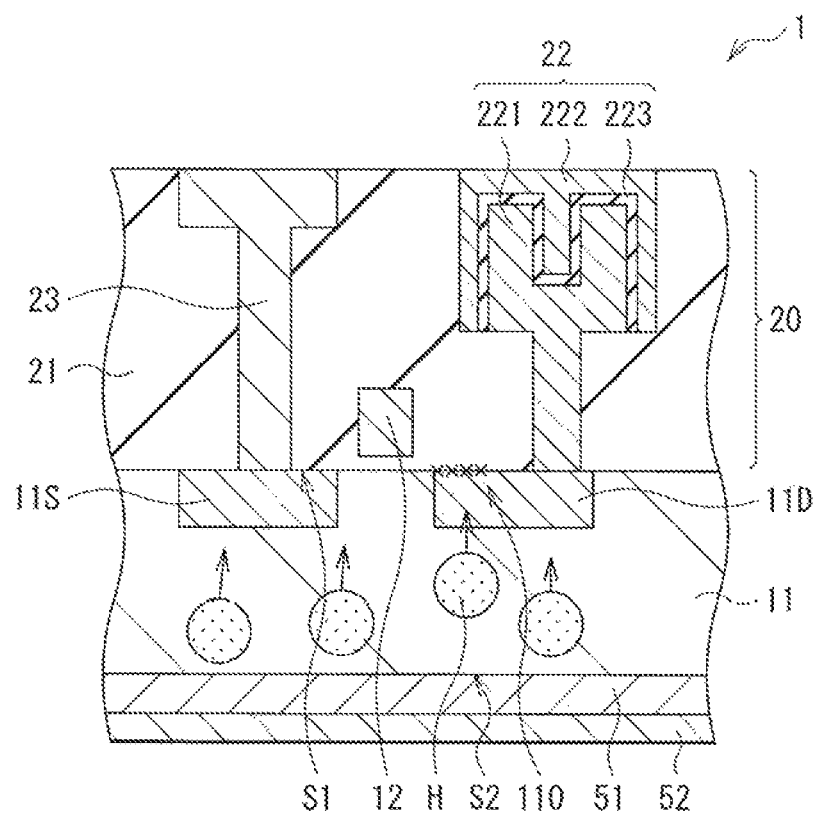

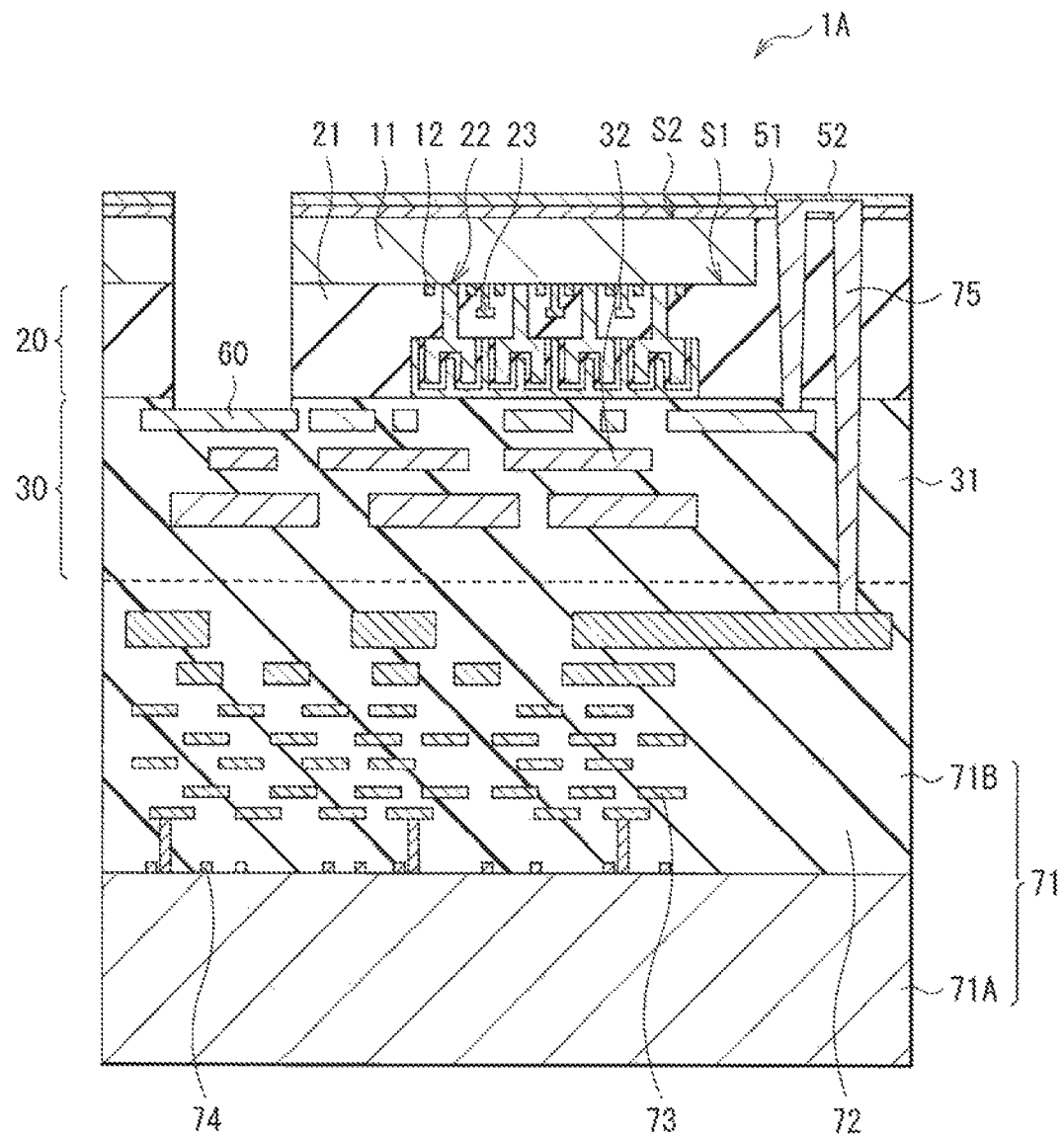
[FIG. 9]

SEMICONDUCTOR DEVICE AND METHOD OF MANUFACTURING THE SAME

CROSS REFERENCE TO RELATED APPLICATIONS

This application is a U.S. National Phase of International Patent Application No. PCT/JP2015/065355 filed on May 28, 2015, which claims priority benefit of Japanese Patent Application No. JP 2014-120852 filed in the Japan Patent Office on Jun. 11, 2014. Each of the above-referenced applications is hereby incorporated herein by reference in its entirety.

TECHNICAL FIELD

The present technology relates to a semiconductor device suitable, for example, for a DRAM (Dynamic Random Access Memory) and a method of manufacturing the same.

BACKGROUND ART

A DRAM includes a transistor and a capacitor in one cell. A source region and a drain region of the transistor are provided in a semiconductor substrate, and the capacitor is electrically coupled to the drain region of the transistor. Whether the one cell is turned on or off is determined by whether an electric charge is accumulated in the capacitor.

The electric charge accumulated in the capacitor is leaked (discharged) with the passage of time. When the electric charge accumulated in the capacitor reaches a predetermined value or less, an error occurs. Hence, the DRAM performs a so-called refresh operation. The refresh operation may be performed several tens of times per second, for example. In order to reduce the number of times of the refresh operation per unit time, namely, in order to improve retention characteristics, hydrogen sintering is performed in manufacturing of the DRAM. The hydrogen sintering is heat treatment in an atmosphere containing hydrogen, and is performed near a final process after forming an insulating film, wiring, and other components on a semiconductor substrate (for example, refer to Patent Literature 1). Hydrogen sintering treatment may be executed also in manufacturing of semiconductor devices such as solid-state imaging devices and logic devices in addition to the DRAM.

CITATION LIST

Patent Literature

Patent Literature 1: Japanese Unexamined Patent Application Publication No. 2003-324185

SUMMARY

However, existing hydrogen sintering treatment has low hydrogen diffusion efficiency, and has difficulty in sufficiently supplying hydrogen to inside of a semiconductor substrate and an interface of the semiconductor substrate.

It is therefore desirable to provide a semiconductor device and a method of manufacturing the same each of which makes it possible to improve efficiency of hydrogen diffusion to inside of a semiconductor substrate and an interface of the semiconductor substrate.

A method of manufacturing a semiconductor device according to an embodiment of the present technology includes: forming an insulating film on a first surface of a semiconductor substrate; and forming a hydrogen supply film on a second surface facing the first surface of the semiconductor substrate, the hydrogen supply film containing one or more of silicon oxide, TEOS, BPSG, BSG, PSG, FSG, carbon-containing silicon oxide, silicon nitride, carbon-containing silicon nitride, and oxygen-containing silicon carbide.

In the method of manufacturing the semiconductor device according to the embodiment of the present technology, the hydrogen supply film is formed on the surface opposite to the first surface on which the insulating film is formed of the semiconductor substrate, i.e., the second surface of the semiconductor substrate, which makes it possible to supply hydrogen from the hydrogen supply film to inside of the semiconductor substrate and an interface of the semiconductor substrate without passing through the insulating film and other components provided on the first surface.

A semiconductor device according to an embodiment of the present technology includes: a semiconductor substrate having a first surface and a second surface, the first surface and the second surface facing each other; an insulating film provided on the first surface of the semiconductor substrate; and a hydrogen supply film provided on the second surface of the semiconductor substrate and containing one or more of silicon oxide, TEOS, BPSG, BSG, PSG, FSG, carbon-containing silicon oxide, silicon nitride, carbon-containing silicon nitride, and oxygen-containing silicon carbide.

In the semiconductor device according to the embodiment of the present technology, the hydrogen supply film is provided on the surface opposite to the first surface provided with the insulating film of the semiconductor substrate, i.e., the second surface of the semiconductor substrate. Accordingly, the semiconductor device is manufactured by supplying hydrogen from the hydrogen supply film to inside of the semiconductor substrate and an interface of the semiconductor substrate without passing through the insulating film and other components provided on the first surface.

According to the semiconductor device and the method of manufacturing the semiconductor device of the embodiments of the present technology, the hydrogen supply film is provided on the second surface of the semiconductor substrate, which makes it possible to suppress a decrease in hydrogen diffusion efficiency caused by the insulating film and other components provided on the first surface. Accordingly, it is possible to improve efficiency of hydrogen diffusion to the inside of the semiconductor substrate and the interface of the semiconductor substrate. Note that effects described here are non-limiting. Effects achieved by the present technology may be one or more of effects described in the present disclosure.

BRIEF DESCRIPTION OF DRAWINGS

FIG. 1 is a cross-sectional view of a configuration of a main part of a semiconductor device according to an embodiment of the present technology.

FIG. 2 is a diagram illustrating an entire configuration of the semiconductor device illustrated in FIG. 1.

FIG. 3A is a cross-sectional view of a process of manufacturing the semiconductor device illustrated in FIG. 1.

FIG. 3B is a cross-sectional view of a process following FIG. 3A.

FIG. 4A is a cross-sectional view of a process following FIG. 3B.

FIG. 4B is a cross-sectional view of a process following FIG. 4A.

FIG. 5A is a cross-sectional view of a process following FIG. 4B.

FIG. 5B is a cross-sectional view of a process following FIG. 5A.

FIG. 6 is a cross-sectional view of a configuration of a semiconductor device according to a comparative example.

FIG. 7 is a cross-sectional view of a state of hydrogen diffusion to a semiconductor substrate illustrated in FIG. 6.

FIG. 8 is a cross-sectional view of a state of hydrogen diffusion to a semiconductor substrate illustrated in FIG. 1.

FIG. 9 is a cross-sectional view of a configuration of a semiconductor device according to a modification example.

EMBODIMENTS FOR CARRYING OUT THE INVENTION

In the following, some embodiments of the present technology are described in detail with reference to the drawings. It is to be noted that description is given in the following order.

1. Embodiment (Semiconductor Device)
2. Modification Example (Example Using Supporting Substrate Provided with Logic Circuit)

Embodiment

[Configuration of Semiconductor Device 1]

FIG. 1 illustrates a cross-sectional configuration of a main part of a semiconductor device (semiconductor device 1) according to an embodiment of the present technology. The semiconductor device 1 includes a capacitor layer 20, a wiring layer 30, and a supporting substrate 41 on one surface (surface S1) of a semiconductor substrate 11. A hydrogen supply film 51 and a diffusion prevention film 52 are provided in this order on a surface (surface S2) facing the surface S1 of the semiconductor substrate 11. A transistor 10T is provided in vicinity of the surface S1 (a first surface) of the semiconductor substrate 11, and a capacitor 22 is provided in the capacitor layer 20. The semiconductor device 1 is a DRAM, and is configured of a cell 10 including the transistor 10T and the capacitor 22.

FIG. 2 illustrates an entire configuration of the semiconductor device 1. In the semiconductor device 1, a plurality of cells 10 are arranged in a matrix. For example, a plurality of bit lines 23 and a plurality of word lines 24 may be respectively provided along a column direction and a row direction. One of the cells 10 is provided at an intersection between each of the bit lines 23 and each of the word lines 24. For example, the respective bit lines 23 may be coupled to a column decoder 123, and in reading of data, a column address may be transferred from the column decoder 123 to the cells 10 through the bit lines 23. For example, the respective word lines 24 may be coupled to a row decoder 124, and in reading of data, a row address may be transferred from the row decoder 124 to the cells 10 through the word lines 24.

Next, description is given of configurations of respective components of the semiconductor device 1 with reference to FIG. 1 again.

The semiconductor substrate 11 may be made of, for example, p-type silicon (Si). The semiconductor substrate 11 may have, for example, a thickness of 2 μm to 100 μm both inclusive. For example, a p-type well region may be provided in vicinity of the surface S1 in the semiconductor substrate 11. A source region 11S and a drain region 11D of the transistor 10T are provided separately from each other in the p-type well region. The source region 11S and the drain region 11D may be each configured of, for example, an n-type semiconductor region. A gate electrode 12 of the transistor 10T is provided on the surface S1 of the semiconductor substrate 11. The gate electrode 12 is provided on the p-type well region between the source region 11S and the drain region 11D. The gate electrode 12 may be made of, for example, poly-Si. The word line 24 (FIG. 2) is electrically coupled to the gate electrode 12. A gate insulating film (not illustrated) is provided between the gate electrode 12 and the semiconductor substrate 11.

The capacitor layer 20 provided on the surface S1 of the semiconductor substrate 11 includes a first insulating film 21 (insulating film), the capacitor 22, and the bit line 23. The first insulating film 21 is provided on the surface S1 of the semiconductor substrate 11, and covers the gate electrode 12. The first insulating film 21 functions as an interlayer insulating film, and may be configured of, for example, silicon oxide (SiO), silicon nitride (SiN), or a laminated film of SiO and SiN. The capacitor 22 is configured of a first electrode 221, a second electrode 222, and a ferroelectric layer 223. For example, the capacitor 22 may be a stacked capacitor, and the first electrode 221, the ferroelectric layer 223, and the second electrode 222 may be stacked in this order on the surface S1 of the semiconductor substrate 11. For example, the first electrode 221 may have a substantially U-like cross-sectional shape, and is electrically coupled to the drain region 11D of the transistor 10T. The second electrode 222 covers the first electrode 221 to fit into the shape of the first electrode 221. The first electrode 221 and the second electrode 222 may be made of, for example, polysilicon (poly-Si), tungsten (W), or a titanium nitride (TiN)-based compound. The material of the first electrode 221 may be different from the material of the second electrode 222. The ferroelectric layer 223 is provided between the first electrode 221 and the second electrode 222, and may be configured of, for example, a laminate of silicon oxide and silicon nitride. For example, a tantalum oxide (TaO)-based compound or a hafnium oxide (HfO)-based compound may be used for the ferroelectric layer 223. The bit line 23 is electrically coupled to the source region 11S of the transistor 10T. The bit lines 23 and the word lines 24 (FIG. 2) may be made of, for example, tungsten, an aluminum-copper (Al—Cu) alloy, an aluminum-silicon (Al—Si) alloy, or copper (Cu). The capacitor layer 20 may have, for example, a thickness of 0.5 μm to 3 μm both inclusive.

The wiring layer 30 is a multilayer wiring layer, and includes a second insulating film 31, a plurality of wiring lines 32, and a pad electrode 60. The second insulating film 31 functions as an interlayer insulating film, and may be configured of, for example, silicon oxide (SiO), silicon nitride (SiN), or a laminated film of SiO and SiN. The wiring lines 32 may be made of, for example, tungsten, an aluminum-copper (Al—Cu) alloy, an aluminum-silicon (Al—Si) alloy, or copper (Cu). The wiring layer 32 may contain titanium (Ti) or titanium nitride. The pad electrode 60 may be electrically coupled to a logic circuit (not illustrated) through a wire (not illustrated), for example. For example, a through hole 60V reaching the pad electrode 60 may be provided, and the wire coupled to the pad electrode 60 is provided in the through hole 60V. The through hole 60V penetrates the diffusion prevention film 52, the hydrogen supply film 51, the semiconductor substrate 11, and the capacitor layer 20 (the first insulating film 21). Such a wiring layer 30 may have, for example, a thickness of 2 μm to 7 μm both inclusive.

The supporting substrate 41 faces the semiconductor substrate 11 with the capacitor layer 20 and the wiring layer 30 in between, and functions as a support of the semiconductor device 1. The supporting substrate 41 may be configured of, for example, a silicon substrate having a thickness of 100 μm to 200 μm both inclusive.

The hydrogen supply film 51 may be subjected to annealing treatment (heat treatment) to generate hydrogen. In the present embodiment, the hydrogen supply film 51 is provided on the surface S2 (a second surface) of the semiconductor substrate 11. This makes it possible to efficiently supply hydrogen to inside of the semiconductor substrate 11 and an interface of the semiconductor substrate 11, as described in detail later.

The hydrogen supply film 51 is a film containing a high content of water or hydrogen, and contains one or more of silicon oxide such as silicon dioxide, TEOS (tetraethoxysilane), BPSG (boron phosphorus silicate glass), BSG (borosilicate glass), PSG (phosphosilicate glass), FSG (fluorosilicate glass), carbon-containing silicon oxide (SiOC), silicon nitride, carbon-containing silicon nitride (SiCN), and oxygen-containing silicon carbide (SiCO). The hydrogen supply film 51 may be configured of a film containing two or more of the materials mentioned above. The hydrogen supply film 51 may be in contact with the surface S2 of the semiconductor substrate 11, for example. The hydrogen supply film 51 may have, for example, a thickness of 100 nm to 1000 nm both inclusive.

The diffusion prevention film 52 is stacked on the hydrogen supply film 51. The diffusion prevention film 52 is provided in contact with a surface, which is opposite to a surface in contact with the semiconductor substrate 11, of the hydrogen supply film 51, and prevents diffusion of hydrogen from the hydrogen supply film 51 to outside. The diffusion prevention film 52 is configured of a film having resistance to transmission of hydrogen or water. More specifically, for example, a film containing one or more of silicon nitride (SiN), silicon oxynitride (SiON), a low-dielectric constant carbon-containing silicon oxide (low-k (SiOC)), and silicon carbide (SiC) may be used for the diffusion prevention film 52. The diffusion prevention film 52 may contain two or more compounds. The diffusion prevention film 52 may have, for example, a thickness of 10 nm to 1000 nm both inclusive. Alternatively, the diffusion prevention film 52 having a thickness of 1000 nm or more may be provided.

[Method of Manufacturing Semiconductor Device 1]

The semiconductor device 1 having such a configuration may be manufactured as follows, for example (FIGS. 3A to 5B).

First, the semiconductor substrate 11 having the surface S1 is prepared. The thickness of the semiconductor substrate 11 at this time may be, for example, from 750 μm to 800 μm both inclusive. Subsequently, the source region 11S and the drain region 11D (FIG. 1) are formed in vicinity of the surface S1 in the semiconductor substrate 11. Thereafter, the gate insulating film and the gate electrode 12 are provided to form the transistor 10T. After providing the transistor 10T, the first insulating film 21, the capacitor 22, and the bit lines 23 are formed. Thus, the capacitor layer 20 is formed on the surface S1 of the semiconductor substrate 11 (FIG. 3A).

Subsequently, the wiring layer 30 is so formed as to be stacked on the capacitor layer 20, as illustrated in FIG. 3B. Thereafter, the supporting substrate 41 having, for example, a thickness of 750 μm to 800 μm both inclusive may be bonded onto the surface S1 of the semiconductor substrate 11 with the capacitor layer 20 and the wiring layer 30 in between, as illustrated in FIG. 4A. The supporting substrate 41 is cut in a later process to reduce its thickness. Subsequently, the semiconductor substrate 11 on surface side opposite to the surface S1 may be cut by, for example, a back grinding method to reduce its thickness, thereby forming the surface S2 of the semiconductor substrate 11 (FIG. 4B).

After thinning the thickness of the semiconductor substrate 11, the hydrogen supply film 51 and the diffusion prevention film 52 are formed in this order on the surface S2 of the semiconductor substrate 11, as illustrated in FIG. 5A. The hydrogen supply film 51 may be formed by forming a film of silicon dioxide with use of, for example, plasma. More specifically, a plasma CVD (chemical vapor deposition) method may be used. HDP (high density plasma) may be used. The diffusion prevention film 52 may be formed by forming a film of silicon nitride with use of, for example, plasma. The diffusion prevention film 52 may be formed with use of an ALD (atomic layer deposition) method. After forming the hydrogen supply film 51 and the diffusion prevention film 52, annealing treatment is performed. For example, the annealing treatment may be performed for 1 to 10 hours in a $N_2H_2$ (at a ratio of hydrogen of 0% to 100% both inclusive) at a temperature of 200° C. to 500° C. both inclusive. The annealing treatment causes hydrogen to be supplied from the hydrogen supply film 51 to the inside of the semiconductor substrate 11 and the interface of the semiconductor substrate 11.

After performing the annealing treatment, the through hole 60V is formed as illustrated in FIG. 5B. Lastly, the pad electrode 60 and the logic circuit (not illustrated) are coupled to each other through the wire (not illustrated). Thus, the semiconductor device 1 is completed.

[Operation of Semiconductor Device 1]

In the semiconductor device 1 of the present embodiment, when a voltage pulse or a current pulse is applied from an unillustrated power source circuit (a pulse applier) to the cell 10 through the bit line 23 and the word line 24, an electric charge amount of the capacitor 22 changes. Accordingly, writing and reading of information is performed. Such an operation is described in detail below.

In a predetermined cell 10, for example, when a voltage of the bit line 23 is increased in a state in which a voltage of the word line 24 is increased, an electric charge is accumulated from the bit line 23 to the capacitor 22 through the transistor 10T. Thus, data is written to the cell 10. In the cell 10 in which the electric charge is accumulated in the capacitor 22, when the voltage of the word line 24 is increased, a discharge current flow through the bit line 23 to instantly increase a potential of the bit line. Data is read by detecting such an increase in the potential of the bit line by a detection circuit.

[Workings and Effects of Semiconductor Device 1]

Herein, in the semiconductor device 1, the capacitor layer 20, the wiring layer 30, and the supporting substrate 41 are stacked on the surface S1 of the semiconductor substrate 11, and the hydrogen supply film 51 is provided on the surface opposite to the surface S1, i.e., the surface S2 of the semiconductor substrate 11. This makes it possible to suppress a decrease in hydrogen diffusion efficiency caused by the capacitor layer 20 and the wiring layer 30 and efficiently supply hydrogen to the inside of the semiconductor substrate 11 and the interface of the semiconductor substrate 11. This is described below.

FIG. 6 illustrates a cross-sectional configuration of a semiconductor device (semiconductor device 100) according to a comparative example. The semiconductor device 100 is a DRAM, and includes the capacitor layer 20 and the wiring layer 30 in this order on the surface S1 of the semiconductor substrate 11. The semiconductor device 100 does not include the hydrogen supply film, and one surface (a surface opposite to the surface S1) of the semiconductor substrate 11 is exposed.

In the DRAM, an electric charge accumulated in the capacitor is leaked with the passage of time. Low retention characteristics cause an increase in power consumption. Moreover, a design for an increase in capacity of the capacitor is necessary, which causes an increase in area of the cell, thereby increasing costs. It is possible to design the capacitor having a high aspect ratio; however, in this case, difficulty in process is increased, and productivity is decreased. Hence, it is desirable to improve the retention characteristics.

As a cause of occurrence of leakage from the drain region, a defect in an interface of the drain region, i.e., the interface of the semiconductor substrate is considered. In order to prevent leakage from the defect in the interface of the semiconductor substrate, a method of performing hydrogen termination on the defect is effective.

FIG. 7 illustrates a hydrogen termination process in manufacturing of the semiconductor device 100. In a process of manufacturing the semiconductor device 100, in order to improve retention characteristics, the capacitor layer 20 and the wiring layer 30 are formed on the surface S1 of the semiconductor substrate 11, and thereafter hydrogen sintering is performed. The hydrogen sintering is used for correction of a defect caused in a manufacturing process in addition to an improvement in the retention characteristics, and is performed near a final process. For this reason, there is a risk of blocking diffusion of hydrogen H by the wiring layer 30 and the capacitor layer 20, thereby causing the hydrogen H not to efficiently reach a defect 110 in the interface of the semiconductor substrate 11. In particular, in a case in which the wiring layer 30 and the capacitor layer 20 contain, for example, a nitrogen compound that blocks diffusion of the hydrogen H and lithium or other material that absorbs the hydrogen H, diffusion efficiency of the hydrogen H decreases. It may be considered to prolong a process time of the hydrogen sintering; however, prolonged hydrogen sintering decreases reliability of wiring. Moreover, it takes a longer time to manufacture the semiconductor device 100, thereby increasing costs.

In contrast, in the semiconductor device 1, the hydrogen supply film 51 is formed on the surface S2 of the semiconductor substrate 11, and hydrogen is supplied from the hydrogen supply film 51 to the inside of the semiconductor substrate 11 and the interface of the semiconductor substrate 11.

FIG. 8 illustrates a process of annealing treatment after forming the hydrogen supply film 51 and the diffusion prevention film 52. The hydrogen supply film 51 is provided on the surface (the surface S2) opposite to the surface S1 of the semiconductor substrate 11 provided with the capacitor layer 20 and the wiring layer 30, which causes the hydrogen H generated from the hydrogen supply film 51 to reach the inside of the semiconductor substrate 11 and the defect 110 in the interface of the semiconductor substrate 11 without passing through the capacitor layer 20 and the wiring layer 30. In other words, diffusion of the hydrogen H is not blocked by the first insulating film 21, the second insulating film 31, the wiring lines 32 of the wiring layer 30, and other components. Accordingly, a decrease in diffusion efficiency of the hydrogen H caused by the capacitor layer 20 and the wiring layer 30 is suppressed, and the hydrogen H is efficiently supplied to the defect 110 in the interface of the semiconductor substrate 11. This makes it possible to effectively perform hydrogen termination on the defect 110 and improve the retention characteristics. Moreover, hydrogen is efficiently supplied, which makes it possible to reduce manufacturing time and improve productivity. Further, hydrogen gas is unnecessary, which makes it possible to reduce costs.

As described above, in the present embodiment, the hydrogen supply film 51 is provided on the surface S2 of the semiconductor substrate 11, which makes it possible to suppress a decrease in diffusion efficiency of the hydrogen H caused by the first insulating film 21 and other components provided on the surface S1 of the semiconductor substrate 11. This makes it possible to improve diffusion efficiency of the hydrogen H to the inside of the semiconductor substrate 11 and the interface of the semiconductor substrate 11.

In particular, in the semiconductor device 1 that is a DRAM, the retention characteristics are improved, which makes it possible to reduce power consumption. Moreover, it is possible to reduce the capacity of the capacitor 22, which makes it possible to reduce the area of the cell 10, thereby reducing costs. Further, flexibility in design of the capacitor 22 is increased, which makes it possible to improve productivity.

Moreover, the diffusion prevention film 52 is stacked on the hydrogen supply film 51, which makes it possible to prevent diffusion of the hydrogen H from the hydrogen supply film 51 to outside. Thus, the hydrogen H is supplied more efficiently from the hydrogen supply film 51 to the semiconductor substrate 11.

Further, the supporting substrate 41 is provided, which makes it possible to maintain strength of the semiconductor device 1 even though the semiconductor substrate 11 having a thinned thickness is used.

Next, description is given of a modification example of the foregoing embodiment. In the following, substantially same components as the components of the foregoing embodiment are denoted by same reference numerals, and any redundant description thereof is omitted.

Modification Example

FIG. 9 illustrates a cross-sectional configuration of a semiconductor device (semiconductor device 1A) according to a modification example of the foregoing embodiment. A logic circuit is provided in a supporting substrate (supporting substrate 71) of the semiconductor device 1A. In other words, the semiconductor device 1A is an eDRAM (embedded DRAM). Other than this point, the semiconductor device 1A has a similar configuration to the configuration of the semiconductor device 1, and workings and effects of the semiconductor device 1A are similar to the workings and the effects of the semiconductor device 1.

The supporting substrate 71 supports the semiconductor device 1A as with the supporting substrate 41 (FIG. 1) described in the foregoing embodiment, and faces the surface S2 of the semiconductor substrate 11 with the capacitor layer 20 and the wiring layer 30 in between. The supporting substrate 71 may include, for example, a semiconductor substrate 71A and a wiring layer 71B, and the wiring layer 71B is provided at a position closer to the wiring layer 30. The semiconductor substrate 71A may be, for example, a silicon (Si) substrate. A transistor is provided in the semiconductor substrate 71A, and a gate electrode 74 is disposed in vicinity of a surface (a surface close to the wiring layer 71B) of the semiconductor substrate 71A. The wiring layer 71B includes a third insulating film 72 and a plurality of wiring lines 73. The logic circuit of the supporting substrate 71 is configured of a transistor and the plurality of wiring lines 73. The logic circuit of the supporting substrate 71 may be electrically coupled to the wiring lines 32 of the wiring layer 30, for example, through the wiring lines 75.

Although description has been made by giving the embodiment and the modification example as mentioned above, the present technology is not limited thereto and may be modified in a variety of ways. For example, the material and thickness of each layer, the method and conditions of forming each layer are not limited to those described in the foregoing embodiment and examples, and each layer may be made of any other material with any other thickness by any other method under any other conditions.

Moreover, in the foregoing embodiment and examples, description has been given of a case in which the semiconductor device includes a stacked capacitor; however, the capacitor may be a trench capacitor.

Further, in the foregoing embodiment and examples, description has been given of a case in which the semiconductor device is a DRAM; however, the semiconductor device of the present technology may be applicable to, for example, an imaging device, a logic circuit, and other devices.

Note that the effects described in the present specification are illustrative and non-limiting. The technology may have effects other than those described in the present specification.

It is to be noted that the present technology may have the following configurations.

(1) A method of manufacturing a semiconductor device, including:
forming an insulating film on a first surface of a semiconductor substrate; and
forming a hydrogen supply film on a second surface facing the first surface of the semiconductor substrate, the hydrogen supply film containing one or more of silicon oxide, TEOS, BPSG, BSG, PSG, FSG, carbon-containing silicon oxide, silicon nitride, carbon-containing silicon nitride, and oxygen-containing silicon carbide.

(2) The method of manufacturing the semiconductor device according to (1) further including performing heat treatment after forming the hydrogen supply film.

(3) The method of manufacturing the semiconductor device according to (1) or (2), wherein the hydrogen supply film is formed in contact with the second surface of the semiconductor substrate.

(4) The method of manufacturing the semiconductor device according to any one of (1) to (3), further including bonding a supporting substrate onto the semiconductor substrate with the insulating film in between.

(5) The method of manufacturing the semiconductor device according to (4), wherein a logic circuit is provided in the supporting substrate.

(6) The method of manufacturing the semiconductor device according to (4) or (5), wherein after bonding the supporting substrate, a thickness of the semiconductor substrate is reduced to form the second surface.

(7) The method of manufacturing the semiconductor device according to any one of (1) to (6), further including, after forming the hydrogen supply film, forming a diffusion prevention film to be stacked on the hydrogen supply film, the diffusion prevention film containing one or more of silicon nitride, silicon oxynitride, low-dielectric constant carbon-containing silicon oxide, and silicon carbide.

(8) The method of manufacturing the semiconductor device according to any one of (1) to (7), wherein a transistor having a source region and a drain region in the semiconductor substrate is formed, and a capacitor layer including the insulating film and a capacitor is formed, and (9) The method of manufacturing the semiconductor device according to (8), further including forming a wiring layer to be stacked on the capacitor layer.

(10) The method of manufacturing the semiconductor device according to (9), wherein a connection hole is formed, the connection hole penetrating the hydrogen supply film, the semiconductor substrate, and the insulating film to reach the wiring layer.

(11) A semiconductor device, including:
a semiconductor substrate having a first surface and a second surface, the first surface and the second surface facing each other;
an insulating film provided on the first surface of the semiconductor substrate; and
a hydrogen supply film provided on the second surface of the semiconductor substrate and containing one or more of silicon oxide, TEOS, BPSG, BSG, PSG, FSG, carbon-containing silicon oxide, silicon nitride, carbon-containing silicon nitride, and oxygen-containing silicon carbide.

This application claims the priority on the basis of Japanese Patent Application No. 2014-120852 filed on Jun. 11, 2014 with Japan Patent Office, the entire contents of which are incorporated in this application by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A method of manufacturing a semiconductor device, comprising:
forming an insulating film on a first surface of a semiconductor substrate;
forming a hydrogen supply film on a second surface, facing the first surface, of the semiconductor substrate, wherein the hydrogen supply film comprises at least one of silicon oxide, tetraethoxysilane (TEOS), boron phosphorus silicate glass (BPSG), borosilicate glass (BSG), phosphosilicate glass (PSG), fluorosilicate glass (FSG), carbon-containing silicon oxide, silicon nitride, carbon containing silicon nitride, or oxygen-containing silicon carbide; and
forming a diffusion prevention film on the hydrogen supply film.

2. The method of manufacturing the semiconductor device according to claim 1, further comprising performing heat treatment after forming the hydrogen supply film.

3. The method of manufacturing the semiconductor device according to claim 1, wherein the hydrogen supply film is formed in contact with the second surface of the semiconductor substrate.

4. The method of manufacturing the semiconductor device according to claim 1, further comprising bonding a supporting substrate onto the semiconductor substrate with the insulating film in between.

5. The method of manufacturing the semiconductor device according to claim 4, wherein a logic circuit is in the supporting substrate.

6. The method of manufacturing the semiconductor device according to claim 4, wherein after bonding the supporting substrate, a thickness of the semiconductor substrate is reduced to form the second surface.

7. The method of manufacturing the semiconductor device according to claim 1, wherein the diffusion prevention film comprises at least one of silicon nitride, silicon oxynitride, low-dielectric constant carbon-containing silicon oxide, or silicon carbide.

8. The method of manufacturing the semiconductor device according to claim 1, wherein a transistor having a source region and a drain region in the semiconductor substrate is formed, and a capacitor layer including the insulating film and a capacitor is formed, and the drain region of the transistor is electrically coupled to the capacitor.

9. The method of manufacturing the semiconductor device according to claim 8, further comprising forming a wiring layer on the capacitor layer.

10. The method of manufacturing the semiconductor device according to claim 9, wherein a connection hole is formed, wherein the connection hole penetrates the hydrogen supply film, the semiconductor substrate, and the insulating film, and wherein one end of the connection hole connects to the wiring layer.

11. A semiconductor device, comprising:
- a semiconductor substrate having a first surface and a second surface, wherein the first surface faces the second surface;
- an insulating film on the first surface of the semiconductor substrate;
- a hydrogen supply film on the second surface of the semiconductor substrate,
    wherein the hydrogen supply film comprises at least one of silicon oxide, tetraethoxysilane (TEOS), boron phosphorus silicate glass (BPSG), borosilicate glass (BSG), phosphosilicate glass (PSG), fluorosilicate glass (FSG), carbon-containing silicon oxide, silicon nitride, carbon-containing silicon nitride, or oxygen-containing silicon carbide; and
- a diffusion prevention film on the hydrogen supply film.

* * * * *